(12) United States Patent
Xie et al.

(10) Patent No.: US 11,777,034 B2
(45) Date of Patent: Oct. 3, 2023

(54) HYBRID COMPLEMENTARY FIELD EFFECT TRANSISTOR DEVICE

(71) Applicant: INTERNATIONAL BUSINESS MACHINES CORPORATION, Armonk, NY (US)

(72) Inventors: Ruilong Xie, Niskayuna, NY (US); Chen Zhang, Guilderland, NY (US); Jingyun Zhang, Albany, NY (US); Junli Wang, Slingerlands, NY (US); Pietro Montanini, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 261 days.

(21) Appl. No.: 17/468,001

(22) Filed: Sep. 7, 2021

(65) Prior Publication Data
US 2023/0075966 A1   Mar. 9, 2023

(51) Int. Cl.
*H01L 29/78* (2006.01)
*H01L 29/06* (2006.01)
(Continued)

(52) U.S. Cl.
CPC ...... *H01L 29/7851* (2013.01); *H01L 27/0922* (2013.01); *H01L 29/0649* (2013.01); *H01L 29/0665* (2013.01); *H01L 29/0673* (2013.01); *H01L 29/0847* (2013.01); *H01L 29/401* (2013.01); *H01L 29/41791* (2013.01); *H01L 29/4238* (2013.01); *H01L 29/42376* (2013.01); (Continued)

(58) Field of Classification Search
CPC ............. H01L 27/0922; H01L 29/0673; H01L 29/0847; H01L 29/401; H01L 29/41791; H01L 29/42376; H01L 29/4238; H01L 29/42392; H01L 29/66439; H01L 29/66545; H01L 29/66795; H01L 29/775; H01L 29/785; H01L 29/78696
See application file for complete search history.

(56) References Cited

U.S. PATENT DOCUMENTS 9,356,027 B1   5/2016   Cheng et al.
10,002,795 B1   6/2018   Bi et al.
(Continued)

FOREIGN PATENT DOCUMENTS

CN   102569409 A   7/2012
CN   113178490 A   7/2021

OTHER PUBLICATIONS

Authors, et al. Disclosed Anonymously, "Separate Channel Release in Stacked Nanosheet Field Effect Transistors by Liner Protection", IPCOM000265848D, May 19, 2021, pp. 1-12.
(Continued)

*Primary Examiner* — Earl N Taylor
(74) *Attorney, Agent, or Firm* — Tutunjian & Bitetto, P.C.; Samuel Waldbaum

(57) ABSTRACT

A stacked transistor device is provided. The stacked transistor device includes a nanosheet transistor device on a substrate; and a fin field effect transistor device over the nanosheet transistor device to form the stacked transistor device, wherein the fin field effect transistor device is configured to have a current flow through the fin field effect transistor device perpendicular to a current flow through the nanosheet transistor device.

20 Claims, 18 Drawing Sheets

(51) Int. Cl.

| | | |
|---|---|---|
| *H01L 29/66* | (2006.01) | |
| *H01L 29/08* | (2006.01) | |
| *H01L 29/417* | (2006.01) | |
| *H01L 29/423* | (2006.01) | |
| *H01L 29/786* | (2006.01) | |
| *H01L 29/775* | (2006.01) | |
| *H01L 29/40* | (2006.01) | |
| *H01L 27/092* | (2006.01) | |
| *B82Y 10/00* | (2011.01) | |

(52) U.S. Cl.
CPC .. *H01L 29/42392* (2013.01); *H01L 29/66439* (2013.01); *H01L 29/66545* (2013.01); *H01L 29/66795* (2013.01); *H01L 29/775* (2013.01); *H01L 29/785* (2013.01); *H01L 29/78696* (2013.01); *B82Y 10/00* (2013.01)

(56) References Cited

U.S. PATENT DOCUMENTS

| | | | |
|---|---|---|---|
| 10,236,217 | B1 | 3/2019 | Ando et al. |
| 10,262,890 | B1 | 4/2019 | Xu et al. |
| 10,297,667 | B1 | 5/2019 | Yeung et al. |
| 10,332,803 | B1 | 6/2019 | Xie et al. |
| 10,381,438 | B2 | 8/2019 | Zhang et al. |
| 11,362,096 | B2 * | 6/2022 | Lin .................. H01L 21/82385 |
| 2018/0323195 | A1 | 11/2018 | Mehandru et al. |
| 2019/0172755 | A1 * | 6/2019 | Smith ................. H01L 21/3065 |
| 2019/0326286 | A1 * | 10/2019 | Xie ....................... H01L 29/401 |
| 2020/0075574 | A1 | 3/2020 | Smith et al. |
| 2020/0294969 | A1 * | 9/2020 | Rachmady ............ H01L 27/088 |
| 2021/0125986 | A1 * | 4/2021 | Vellianitis ....... H01L 21/823821 |
| 2021/0202497 | A1 * | 7/2021 | Lin .................. H01L 21/30604 |
| 2021/0233910 | A1 | 7/2021 | Yeh et al. |
| 2021/0249412 | A1 | 8/2021 | Bi et al. |

OTHER PUBLICATIONS

Authors, et al. Disclosed Anonymously, "Localized Si on Oxide/NS stack/Si Substrate Formation", IPCOM000265849D, May 19, 2021, pp. 1-8.

* cited by examiner

HYBRID COMPLEMENTARY FIELD EFFECT TRANSISTOR DEVICE

BACKGROUND

The present invention generally relates to stacked transistor devices, and more particularly to a stacked transistor device with a fin transistor over a nanosheet transistor.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., parallel with the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a stacked transistor device is provided. The stacked transistor device includes a nanosheet transistor device on a substrate; and a fin field effect transistor device over the nanosheet transistor device to form the stacked transistor device, wherein the fin field effect transistor device is configured to have a current flow through the fin field effect transistor device perpendicular to a current flow through the nanosheet transistor device.

In accordance with another embodiment of the present invention, a stacked transistor device is provided. The stacked transistor device includes a plurality of stacked semiconductor channel segments on a substrate, and a nanosheet source/drain region on each of opposite sides of the plurality of stacked semiconductor channel segments. The stacked transistor device further includes a fin section over the plurality of stacked semiconductor channel segments, and a fin source/drain on each of opposite sides of the fin section. The stacked transistor device further includes a shared gate structure on the fin section and the plurality of stacked semiconductor channel segments, wherein the two nanosheet source/drain regions are on opposite sides of the shared gate structure, and the two fin source/drains are on opposite sides of the shared gate structure, such that the two nanosheet source/drain regions are on different sides of the shared gate structure than the two fin source/drains.

In accordance with yet another embodiment of the present invention, a method of forming a stacked transistor device is provided. The method includes forming a plurality of stacked semiconductor channel segments and a fin section over the plurality of stacked semiconductor channel segments on a substrate. The method further includes forming a nanosheet source/drain region on each of opposite sides of the plurality of stacked semiconductor channel segments, and forming a fin source/drain on each of opposite sides of the fin section. The method further includes forming a shared gate structure on the fin section and the plurality of stacked semiconductor channel segments, wherein the two nanosheet source/drain regions are on opposite sides of the shared gate structure, and the two fin source/drains are on opposite sides of the shared gate structure, such that the two nanosheet source/drain regions are on different sides of the shared gate structure than the two fin source/drains.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a hybrid complementary field effect transistor (CFET) device having a fin field effect transistor (FinFET) on top of a nanosheet field effect transistor (NSFET). In various embodiments, the FinFET can be a p-type field effect transistor (pFET) and the NSFET can be an n-type field effect transistor (nFET) to form the complementary device. The stacked transistor device with a fin transistor over a nanosheet transistor can have orthogonal current flow directions between top device and bottom device. In various embodiments, the current flow direction of the top FinFET is perpendicular to the current flow direction of bottom NSFET. This facilitates the S/D contact formation, because S/D epitaxy of the top device does not overlap the S/D epitaxy of bottom device.

Embodiments of the present invention provide a method of forming a hybrid complementary field effect transistor (CFET) device involving forming a stacked set of alternating nanosheet sections on a substrate and a vertical fin on the stack of nanosheet sections. In various embodiments, the gate structure can be a shared gate structure that is on both the FinFET and the NSFET and controls the switching and current through both devices.

Exemplary applications/uses to which the present invention can be applied include, but are not limited to: logic devices (e.g., NAND Gates, NOR gates, XOR gates, etc.), processors (e.g., central processing units (CPUs), graphics processing units (GPUs)), and memory devices (e.g., static random access memory (SRAM), etc.).

It is to be understood that aspects of the present invention will be described in terms of a given illustrative architecture; however, other architectures, structures, substrate materials and process features and steps can be varied within the scope of aspects of the present invention.

Figure 1:
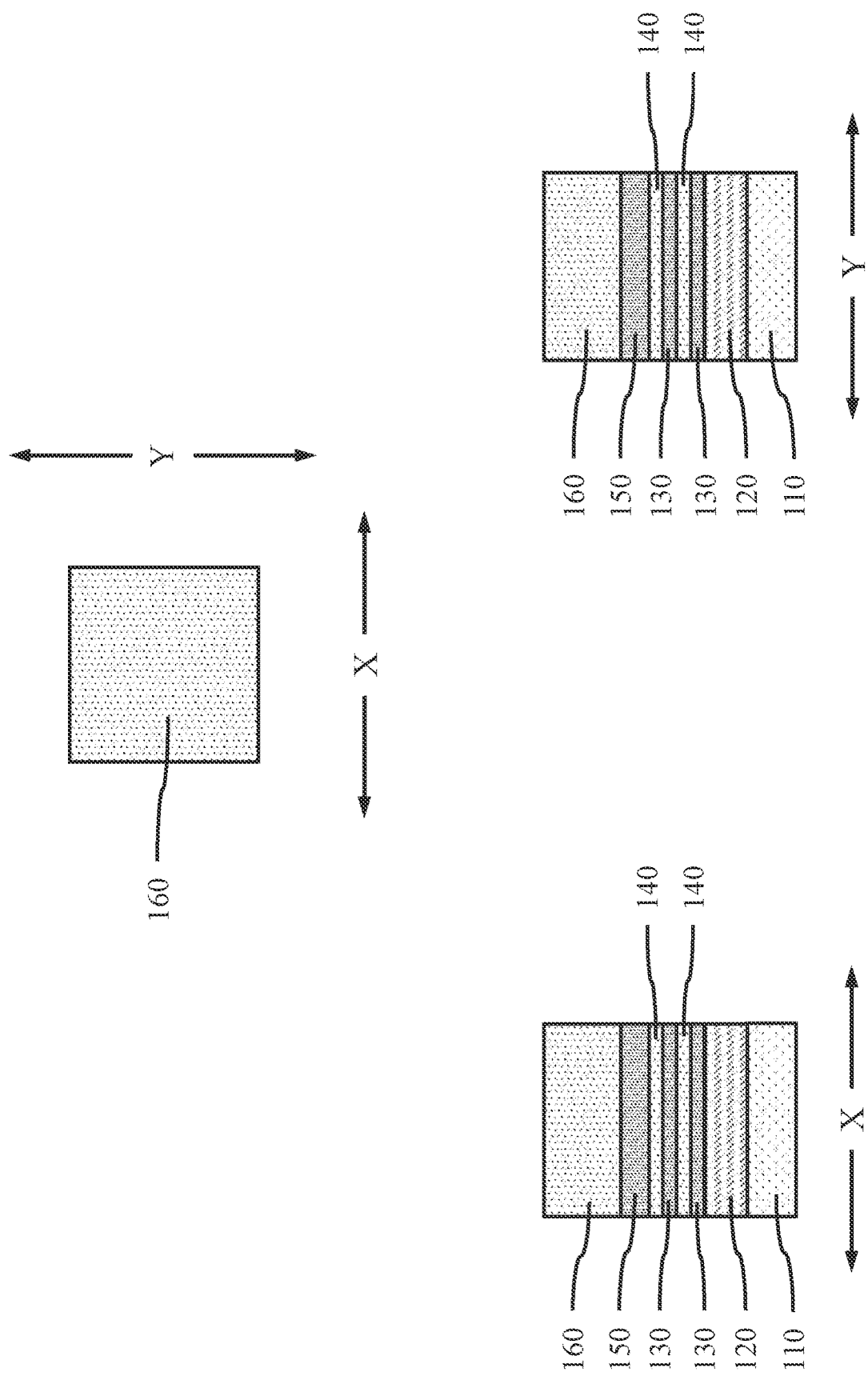
FIG. 1 illustrates a top and cross-sectional side views showing an insulating layer on a substrate, a stack of alternating sacrificial semiconductor layers and semiconductor nanosheet layers on the insulating layer, and a fin semiconductor layer on the stack of alternating layers, in accordance with an embodiment of the present invention.

Referring now to the drawings in which like numerals represent the same or similar elements and initially to FIG. 1, FIG. 1 illustrates a top and cross-sectional side views showing an insulating layer on a substrate, a stack of alternating sacrificial semiconductor layers and semiconductor nanosheet layers on the insulating layer, and a fin semiconductor layer on the stack of alternating layers, in accordance with an embodiment of the present invention.

In one or more or more embodiments, a series of alternating sacrificial spacer layers 130 and semiconductor channel layers 140 can be formed on an insulating layer 120, where the insulating layer can be part of a substrate 110. In various embodiments, the sacrificial spacer layers 130 and semiconductor channel layers 140 can be formed by epitaxial growth or heteroepitaxial growth on an underlying layer, where the underlying layer can be a single crystal. In various embodiments, a top sacrificial spacer layer 150 can be on a channel layer 140, where the top sacrificial spacer layer 150 can be thicker than the other alternating sacrificial spacer layers 130.

In one or more embodiments, the substrate 110 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the material of the active semiconductor layer can be selectively removable relative to an overlying channel layer 140. In various embodiments, the substrate 110 can be a semiconductor material, where the semiconductor material can be single crystal, polycrystalline, microcrystalline, and/or amorphous, where the substrate 110 can provide physical support for an insulating layer 120.

In one or more embodiments, the insulating layer 120 can be an insulating dielectric material, for example, silicon oxide (SiO) or silicon nitride (SiN), where the insulating layer 120 can be a buried oxide layer (BOX) on the substrate 110. The substrate 110 can act as a carrier layer for the insulating layer 120.

In one or more embodiments, the sacrificial spacer layers 130 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the material of the sacrificial spacer layers 130 is different from the material of the semiconductor channel layers 140 to allow selective removal, while providing for epitaxial or heteroepitaxial growth on the alternating layers.

In a non-limiting exemplary embodiments, the sacrificial spacer layers 130 can be silicon germanium (SiGe) having a predetermined germanium concentration to allow selective removal of the spacer layers 130.

In one or more embodiments, the sacrificial spacer layers 130 can have a thickness in a range of about 6 nanometers (nm) to about 30 nm, or about 8 nm to about 15 nm, to provide sufficient distance between the channel layers 140 to form a gate-all-around (GAA) structure.

In one or more embodiments, the channel layers 140 can have a thickness in a range of about 4 nanometers (nm) to about 12 nm, or about 6 nm to about 9 nm, although other thicknesses are also contemplated.

In one or more embodiments, the top sacrificial spacer layer 150 can have a thickness in a range of about 12 nanometers (nm) to about 60 nm, or about 16 nm to about 30 nm, where the top sacrificial spacer layer 150 can be about twice (2x) the thickness of the sacrificial spacer layers 130 to provide sufficient distance between the fin semiconductor layer 160 and an uppermost channel layer 140 for over-etching and vertical fin 162.

In one or more embodiments, the fin semiconductor layer 160 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)). The semiconductor channel layers 140 can be single crystal to provide for epitaxial or heteroepitaxial growth.

In one or more embodiments, the fin semiconductor layer 160 can have a thickness in a range of about 20 nanometers (nm) to about 100 nm, or about 35 nm to about 60 nm, although other thicknesses are also contemplated. The thickness of the fin semiconductor layer 160 can be sufficient to provide a channel width for the upper FinFET device suitable for the intended device characteristics (e.g., current capacity, switching time, etc.).

In a non-limiting exemplary embodiment, the device stack formation can be on a SOI substrate, where the insulating layer 120 (buried oxide) is formed on substrate 110. A semiconductor layer (e.g., silicon (Si) layer (not shown) can be on the insulating layer 120, and can be thinned down, followed by a silicon-germanium (SiGe) epitaxial growth followed by SiGe condensation to covert the first semiconductor layer over insulating layer 120 to a SiGe sacrificial spacer layer 130. After that, an oxide layer (not shown) on the bottom last SiGe layer 130 can be removed by DHF, followed by epitaxy growth of alternative Si and SiGe layers (140, 130, 150, 160). Please also note that though we illustrate this invention using an SOI substrate, the invention method and structure also works for different substrate(s), such as a bulk Si substrate, where no buried oxide 120 is present, and alternative SiGe and Si epitaxy layers directly grown over an Si substrate 110.

Figure 2:
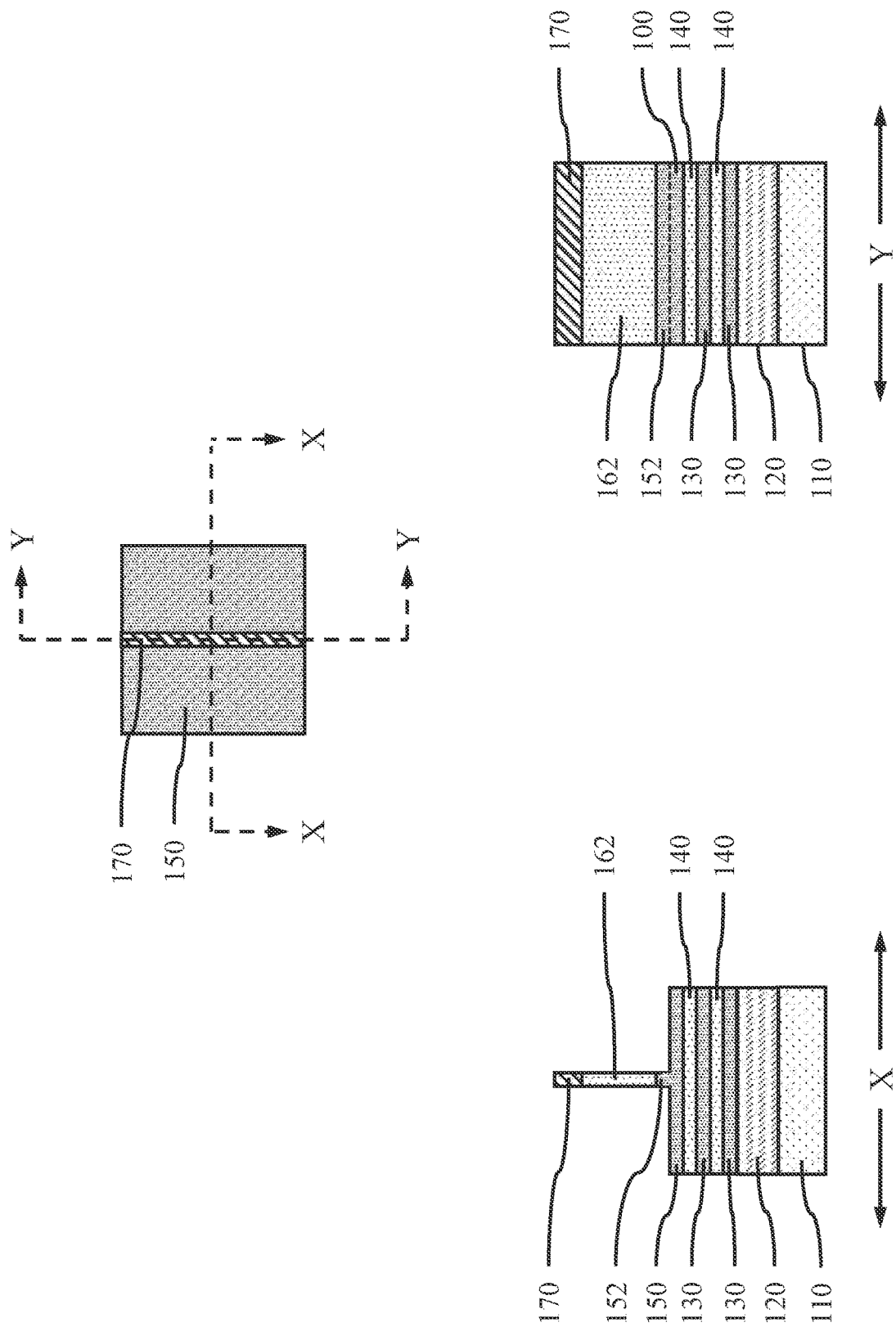
FIG. 2 illustrates a top and cross-sectional side views showing a fin template on a vertical fin formed from the fin semiconductor layer on a sacrificial beam above the stack of alternating layers, in accordance with an embodiment of the present invention.

FIG. 2 illustrates a top and cross-sectional side views showing a fin template on a vertical fin formed from the fin semiconductor layer on a sacrificial beam above the stack of alternating layers, in accordance with an embodiment of the present invention.

In various embodiments, a patterning process can be used to form a vertical Fin with top semiconductor layer 160 and portions of top sacrificial spacer layer 150.

In one or more embodiments, one or more fin template(s) 170 can be formed on the fin semiconductor layer 160, where the fin template(s) 170 can be formed by patterning and etching a fin template layer using lithographic and etching methods.

In various embodiments, the fin template(s) 170 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

In one or more embodiments, a vertical fin 162 can be formed from the fin semiconductor layer 160 using a selective, directional etch, for example, a reactive ion etch (RIE). Exposed portions of the fin semiconductor layer 160 and an upper portion of the top sacrificial spacer layer 150 can be removed such that the height of the top sacrificial spacer layer 150 is reduced and a sacrificial beam 152 is formed beneath the vertical fin 162.

Figure 3:
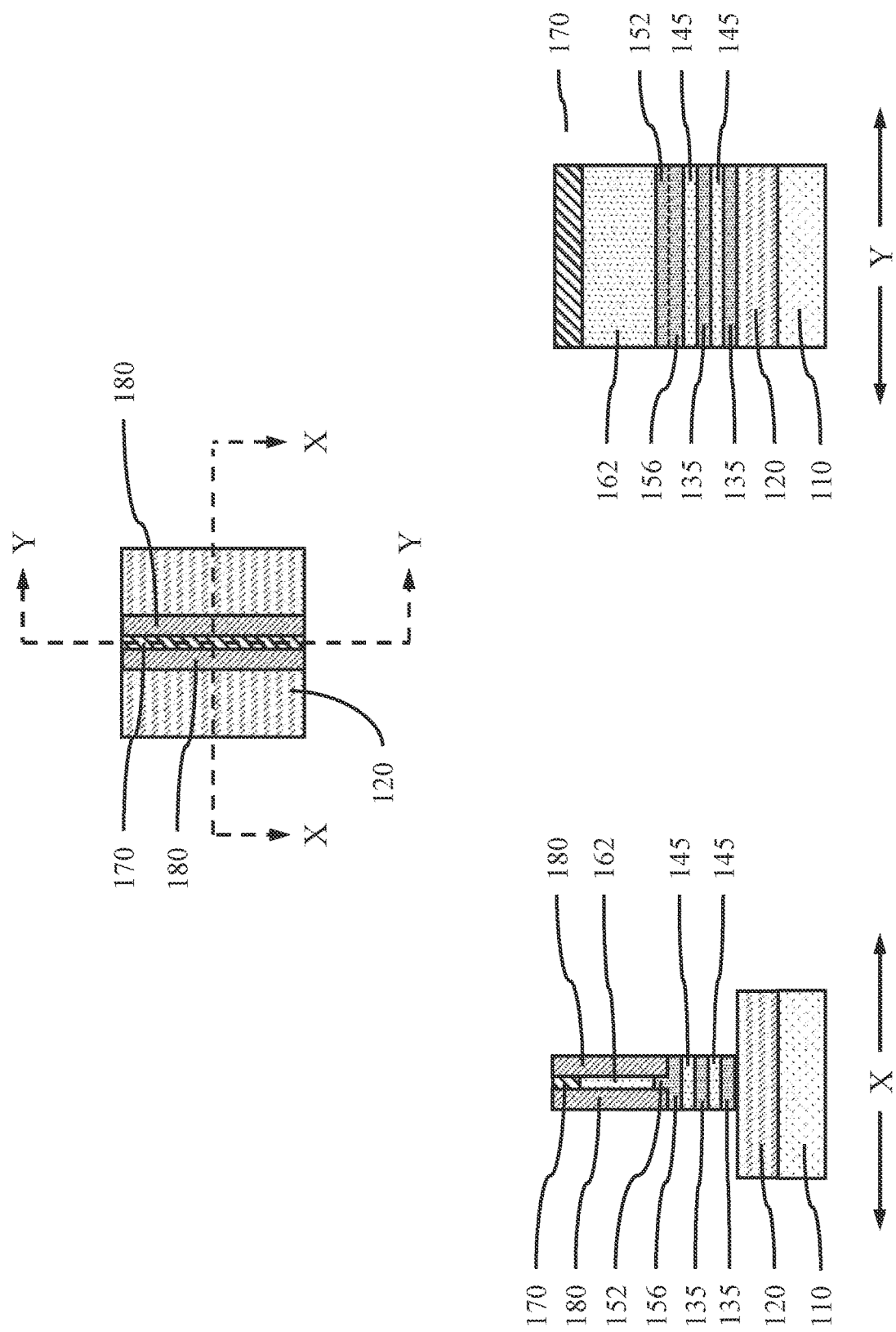
FIG. 3 illustrates a top and cross-sectional side views showing sacrificial spacers formed on opposite sides of the fin template and vertical fin, and alternating sacrificial semiconductor sections and semiconductor nanosheet sections formed from the stack of alternating layers by trimming, in accordance with an embodiment of the present invention.

FIG. 3 illustrates a top and cross-sectional side views showing sacrificial spacers formed on opposite sides of the fin template and vertical fin, and alternating sacrificial semiconductor sections and semiconductor nanosheet sections formed from the stack of alternating layers by trimming, in accordance with an embodiment of the present invention.

In one or more embodiments, sacrificial spacers 180 can be formed on opposite sides of the fin template 170 and vertical fin 162, where the sacrificial spacers 180 can be formed by depositing a conformal layer using, for example, atomic layer deposition (ALD), and removing horizontal portions from the top sacrificial spacer layer 150 with an anisotropic spacer etch (e.g., RIE).

In various embodiments, the sacrificial spacers 180 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

In one or more embodiments, the sacrificial spacers 180 can have a width in a range of about 5 nm to about 25 nm, or about 8 nm to about 15 nm, although other thicknesses are also contemplated.

In one or more embodiments, a directional etch (e.g., RIE) can be used to trim the top sacrificial spacer layer 150, semiconductor channel layers 140, and sacrificial spacer layers 130 by removing the portions not covered by the fin template(s) 170 and sacrificial spacers 180. The etch can be down to the insulating layer 120, such that the surface of the insulating layer 120 is exposed.

Removing the portions of the top sacrificial spacer layer 150, semiconductor channel layers 140, and sacrificial spacer layers 130 forms top sacrificial spacer section 156, sacrificial semiconductor sections 135, and semiconductor channel sections 145.

Figure 4:
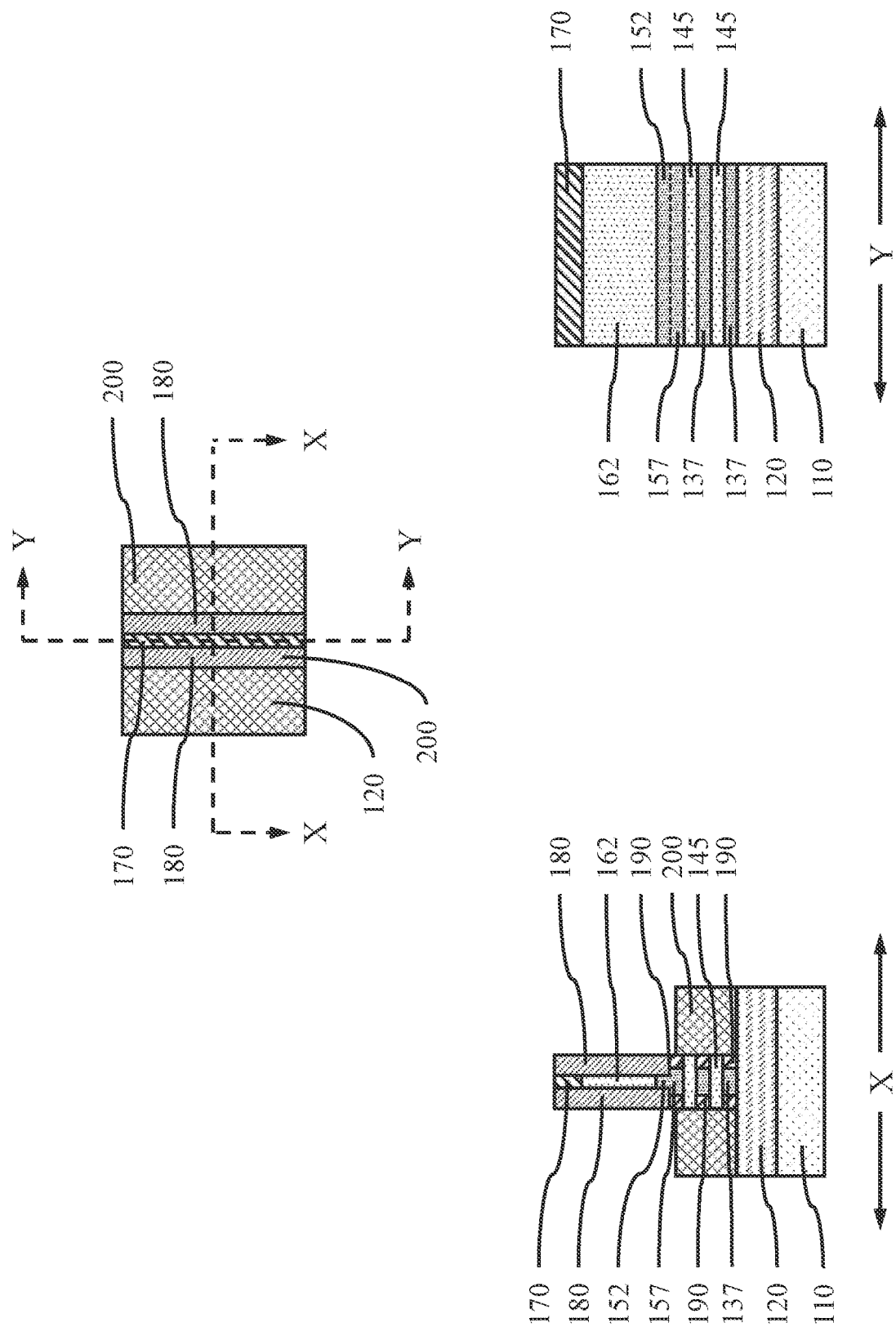
FIG. 4 illustrates a top and cross-sectional side views showing inner spacers formed in recesses in the sacrificial semiconductor sections, and nanosheet source/drain regions formed on opposite sides of the semiconductor nanosheet sections above the insulating layer, in accordance with an embodiment of the present invention.

FIG. 4 illustrates a top and cross-sectional side views showing inner spacers formed in recesses in the sacrificial semiconductor sections, and nanosheet source/drain regions formed on opposite sides of the semiconductor nanosheet sections above the insulating layer, in accordance with an embodiment of the present invention.

In one or more embodiments, portions of the sacrificial semiconductor sections 135 and top sacrificial spacer section 156 can be removed using an isotropic etch, for example, a wet chemical etch or dry plasma etch, to form recesses. An inner spacer layer can be deposited using a conformal deposition, for example, atomic layer deposition (ALD) or plasma enhanced ALD (PEALD), and portions of the inner spacer layer removed by a selective etch to form inner spacers 190. Removal of the portions of the sacrificial semiconductor sections 135 and top sacrificial spacer section 156 can form a sacrificial beam 152 beneath the vertical fin 162 and a wider top sacrificial bar 157 on the uppermost semiconductor nanosheet section 145.

In various embodiments, the inner spacers 190 can be an insulating dielectric material, including, but not limited to, silicon oxide (SiO), silicon nitride (SiN), silicon oxynitride (SiON), a low-k dielectric material, or a combination thereof. A low-k dielectric material can be, for example, fluorine-doped silicon oxide (SiO:F), carbon-doped silicon oxide (SiO:C), a polymeric material, for example, tetraethyl orthosilicate (TEOS), hydrogen silsesquioxane (HSQ) and methylsilsesquioxane (MSQ), organo-silicon compounds (SiCOH), and combinations thereof.

In one or more embodiments, nanosheet source/drain regions 200 can be formed on opposite sides of the semiconductor nanosheet sections 145 above the insulating layer 120, where the nanosheet source/drain regions 200 can be formed by a lateral epitaxial growth process. In various embodiments, another stacked FET can be formed next to the S/D epi 200, so there won't be an empty space next to S/D epi 200.

In various embodiments, the nanosheet source/drain regions 200 are doped semiconductor material (e.g., Si, SiGe, etc.), where the semiconductor material can be n-doped or p-doped depending on the type of device being formed (i.e., n-type or p-type).

In various embodiments, the nanosheet source/drain regions 200 can have a width in a range of about 8 nm to about 100 nm, or about 12 nm to about 30 nm, although other thicknesses are also contemplated.

Figure 5:
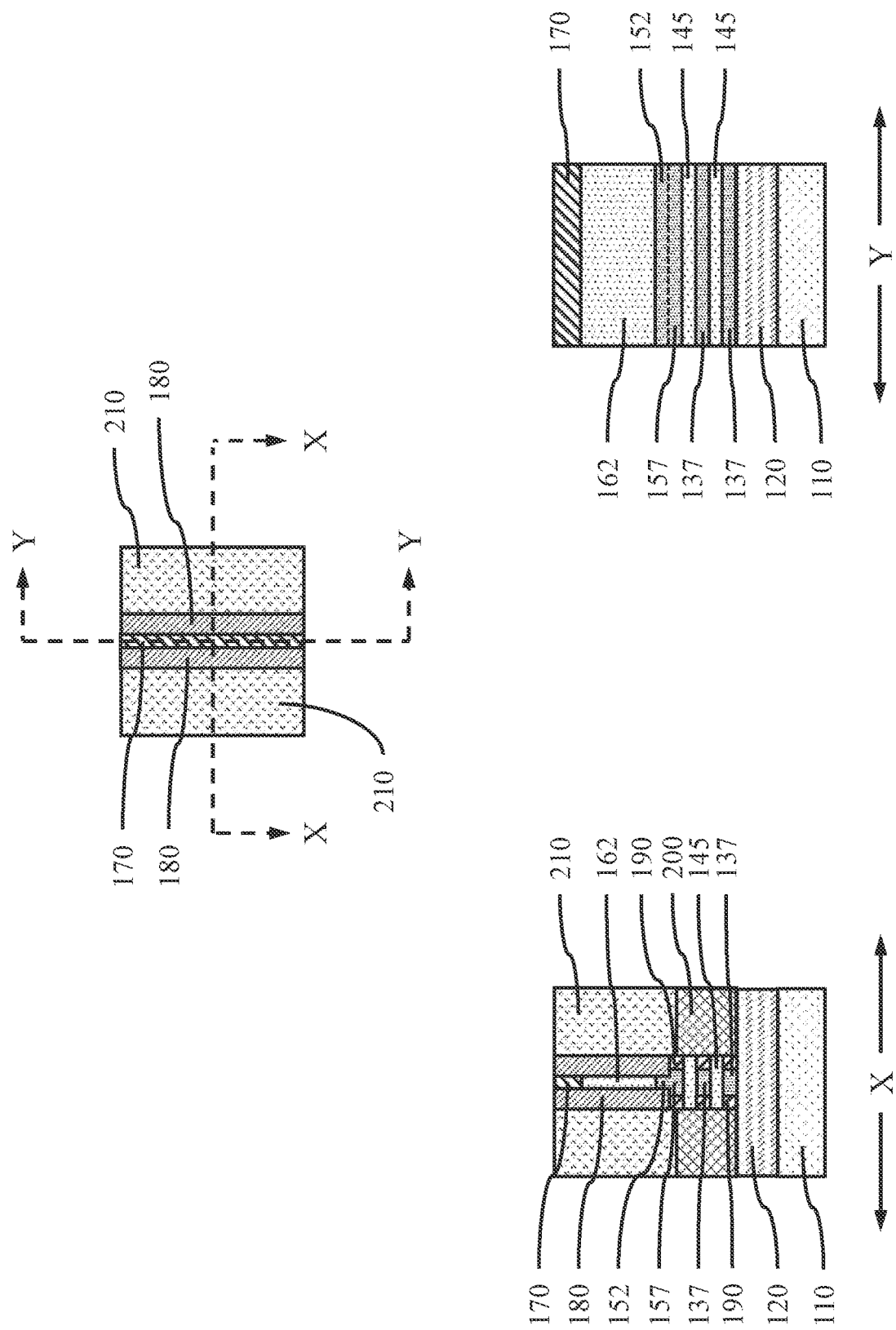
FIG. 5 illustrates a top and cross-sectional side views showing a dielectric fill layer formed on the nanosheet source/drain regions and sacrificial spacers, in accordance with an embodiment of the present invention.

FIG. 5 illustrates a top and cross-sectional side views showing a dielectric fill layer formed on the nanosheet source/drain regions and sacrificial spacers, in accordance with an embodiment of the present invention.

In one or more embodiments, a dielectric fill layer 210 can be formed on the nanosheet source/drain regions 200 and sacrificial spacers 180, where the dielectric fill layer 210 can be formed by a blanket deposition, for example, chemical vapor deposition (CVD) or plasma enhanced CVD (PECVD). The dielectric fill layer 210 can be an insulating dielectric material, including, but not limited to, silicon oxide (SiO), silicon nitride (SiON), silicon oxynitride (SiON), a low-k dielectric material, or a combination thereof.

Figure 6:
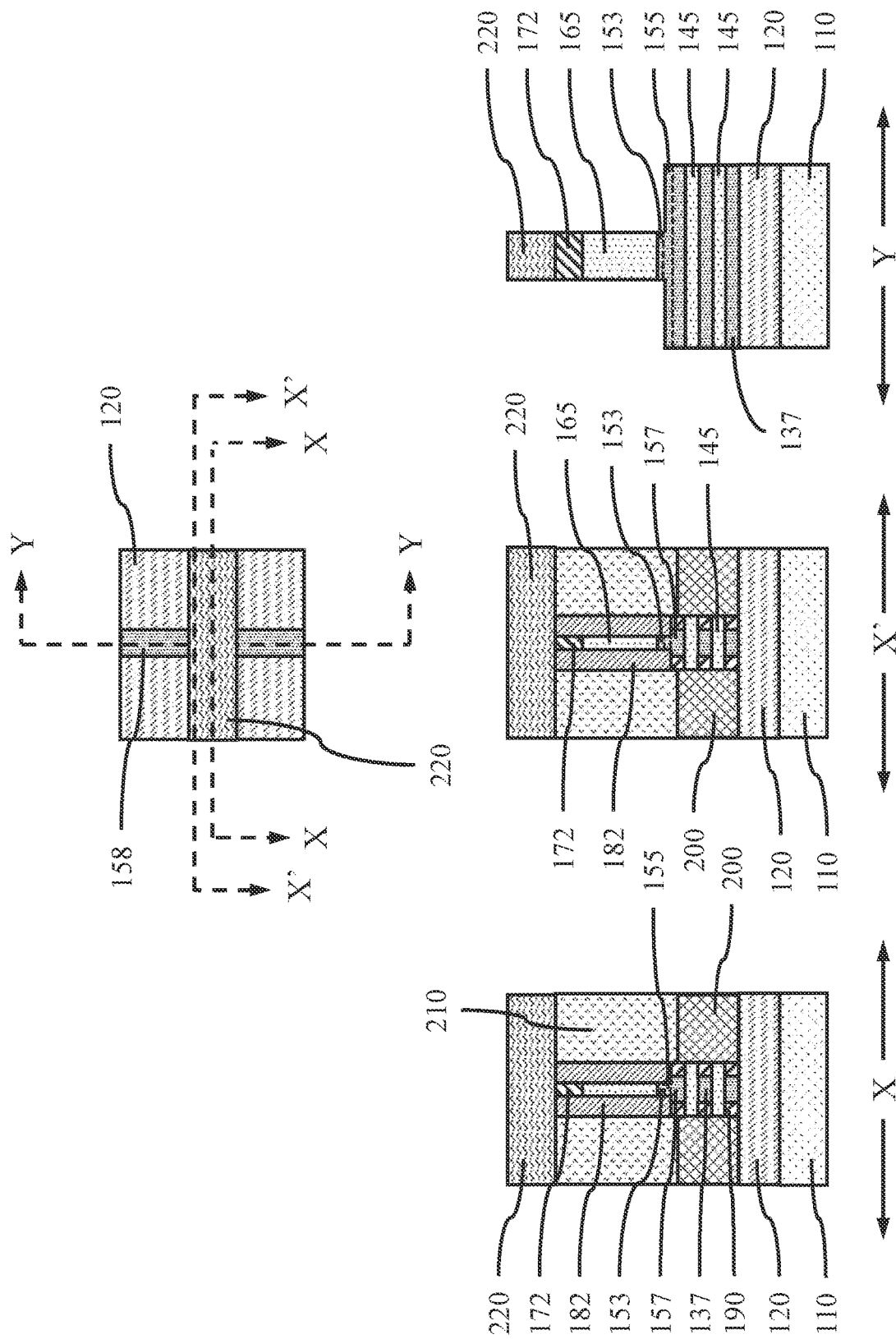
FIG. 6 illustrates a top and cross-sectional side views showing formation of a gate template from a gate template layer on the fin template, and removal of exposed portions of the fin template and underlying vertical fin from opposite sides of the gate template to form a fin section, a sacrificial pad and sacrificial plate from the sacrificial beam, in accordance with an embodiment of the present invention.

FIG. 6 illustrates a top and cross-sectional side views showing formation of a gate template from a gate template layer on the fin template, and removal of exposed portions of the fin template and underlying vertical fin from opposite sides of the gate template to form a fin section, a sacrificial pad and sacrificial plate from the sacrificial beam, in accordance with an embodiment of the present invention.

In one or more embodiments, a gate template 220 can be formed from a gate template layer on the fin template 170, sacrificial spacers 180, and dielectric fill layer 210, where the gate template 220 can be formed using lithography and etching. The gate template 220 can be approximately (within the tolerances of the fabrication processes used) perpendicular to the fin template 170 and sacrificial spacers 180.

In one or more embodiments, portions of the fin template 170, sacrificial spacers 180, and dielectric fill layer 210 exposed on opposite sides of the gate template 220 can be removed using directional etch(es) to trim the vertical fin 162 and form a fin section 165 on a sacrificial pad 153 beneath the fin section. The exposed portions of the sacrificial spacers 180 can be removed to form sacrificial spacer sections 182. The exposed portions of the fin template 170 can be removed to form a fin template section 172. An exposed upper portion of the sacrificial beam 152 can be removed to form the sacrificial pad 153 under the fin section, and the remaining portion of the sacrificial beam 152 can form a sacrificial plate 155 extending outward from opposite sides of the gate template 220. A wider top sacrificial bar 157 under the sacrificial spacer sections 182 can extend outward from opposite sides of the gate template 220.

Figure 7:
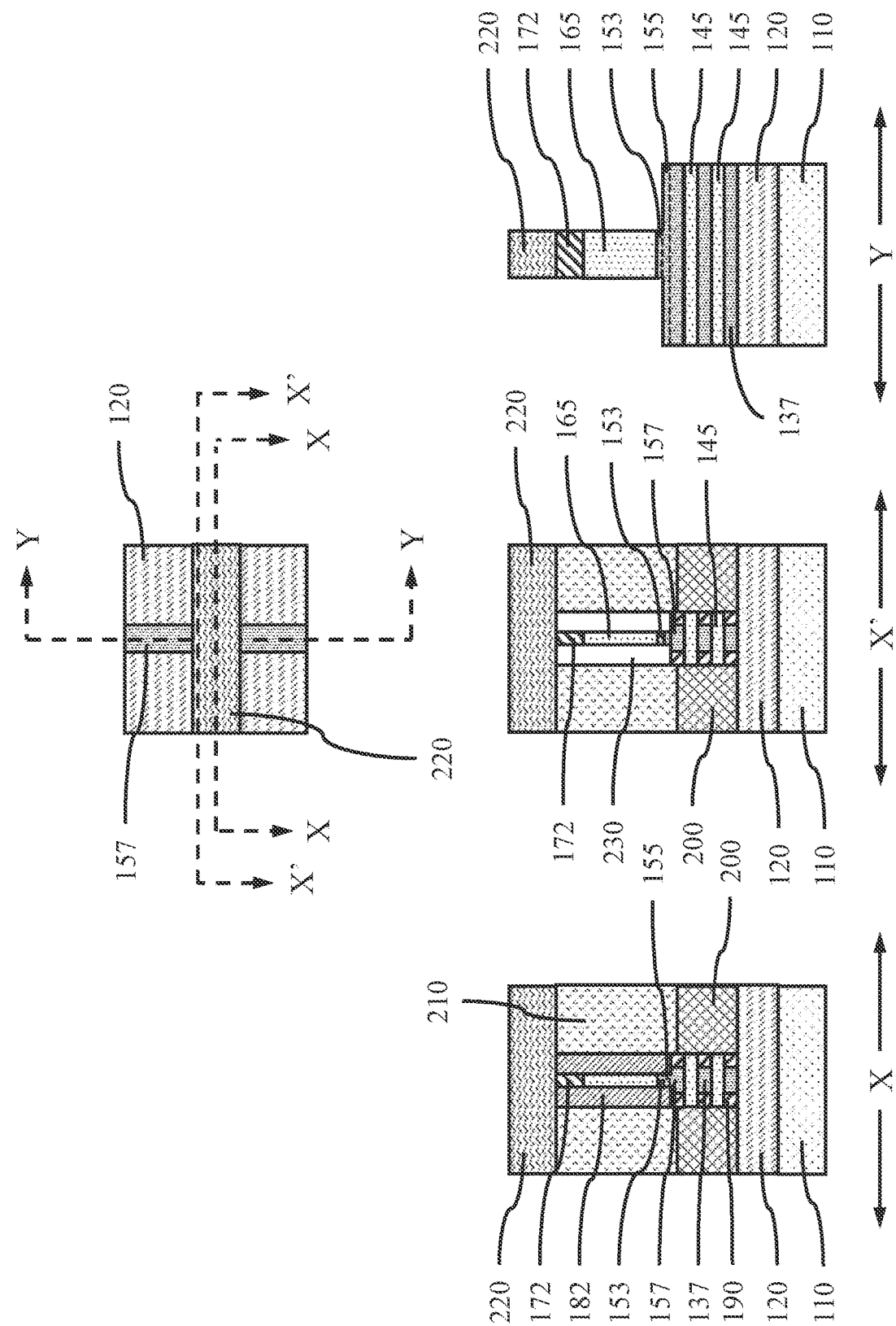
FIG. 7 illustrates a top and cross-sectional side views showing removal of portions of the sacrificial spacer sections from opposite sides of the vertical fin section with remaining portions of the sacrificial spacers on opposite sides of the vertical fin section, in accordance with an embodiment of the present invention.

FIG. 7 illustrates a top and cross-sectional side views showing removal of portions of the sacrificial spacer sections from opposite sides of the vertical fin section with remaining portions of the sacrificial spacers on opposite sides of the vertical fin section, in accordance with an embodiment of the present invention.

In one or more embodiments, outer portions of the sacrificial spacer sections 182 on opposite sides of the gate template 220 can be removed from opposite sides of the vertical fin section 165 (see X' cross-section), while inner portions of the sacrificial spacer sections 182 remain on opposite sides of the vertical fin section 165 (see X cross-section). The portions of the sacrificial spacer sections 182 can be removed using a selective, isotropic etch (e.g., dry plasma etch), that can form a gap 230 between the fin section 165 and the dielectric fill layer 210. The fin template section 172 can remain on the fin section 165. Removal of the sacrificial spacer sections 182 can expose the uppermost inner spacers 190, sidewalls of the sacrificial pad 153 and sacrificial plate 155, and a top surface of the top sacrificial bar 157.

Figure 8:
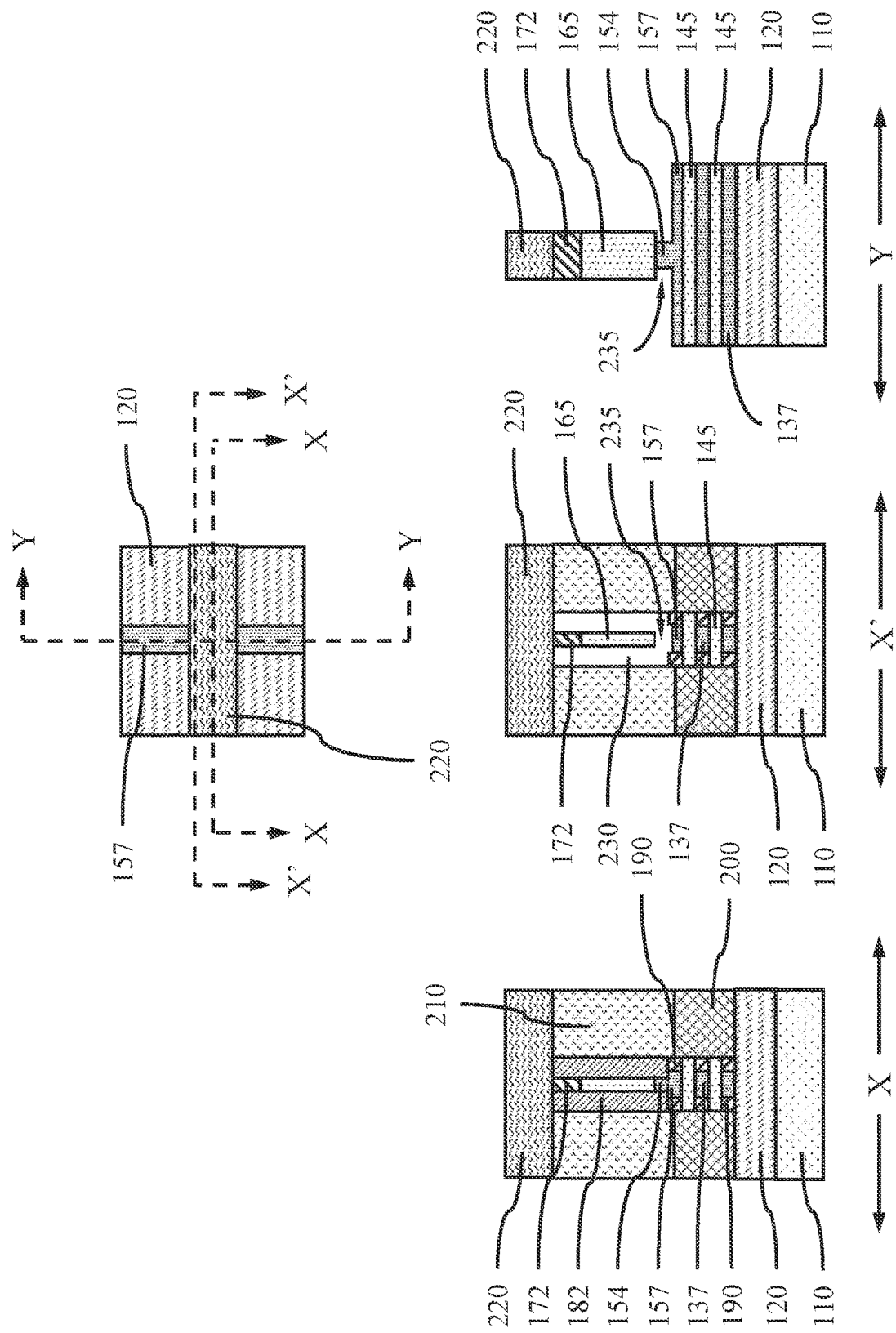
FIG. 8 illustrates a top and cross-sectional side views showing removal of a portion of the sacrificial pad and sacrificial plate from below the fin section to form collar indentations beneath outer edges of the fin section, and the remaining portion of the sacrificial beam, in accordance with an embodiment of the present invention.

FIG. 8 illustrates a top and cross-sectional side views showing removal of a portion of the sacrificial pad and sacrificial plate from below the fin section to form collar indentations beneath outer edges of the fin section, and the remaining portion of the sacrificial beam, in accordance with an embodiment of the present invention.

In one or more embodiments, outer portions of the sacrificial pad 153 and sacrificial plate 155 can be removed using a selective etch to form collar indentations 235 beneath outer edges of the fin section 165 (see Y cross-section). An upper portion of the top sacrificial bar 157 may be removed by the selective etching (see X' cross-section).

Figure 9:
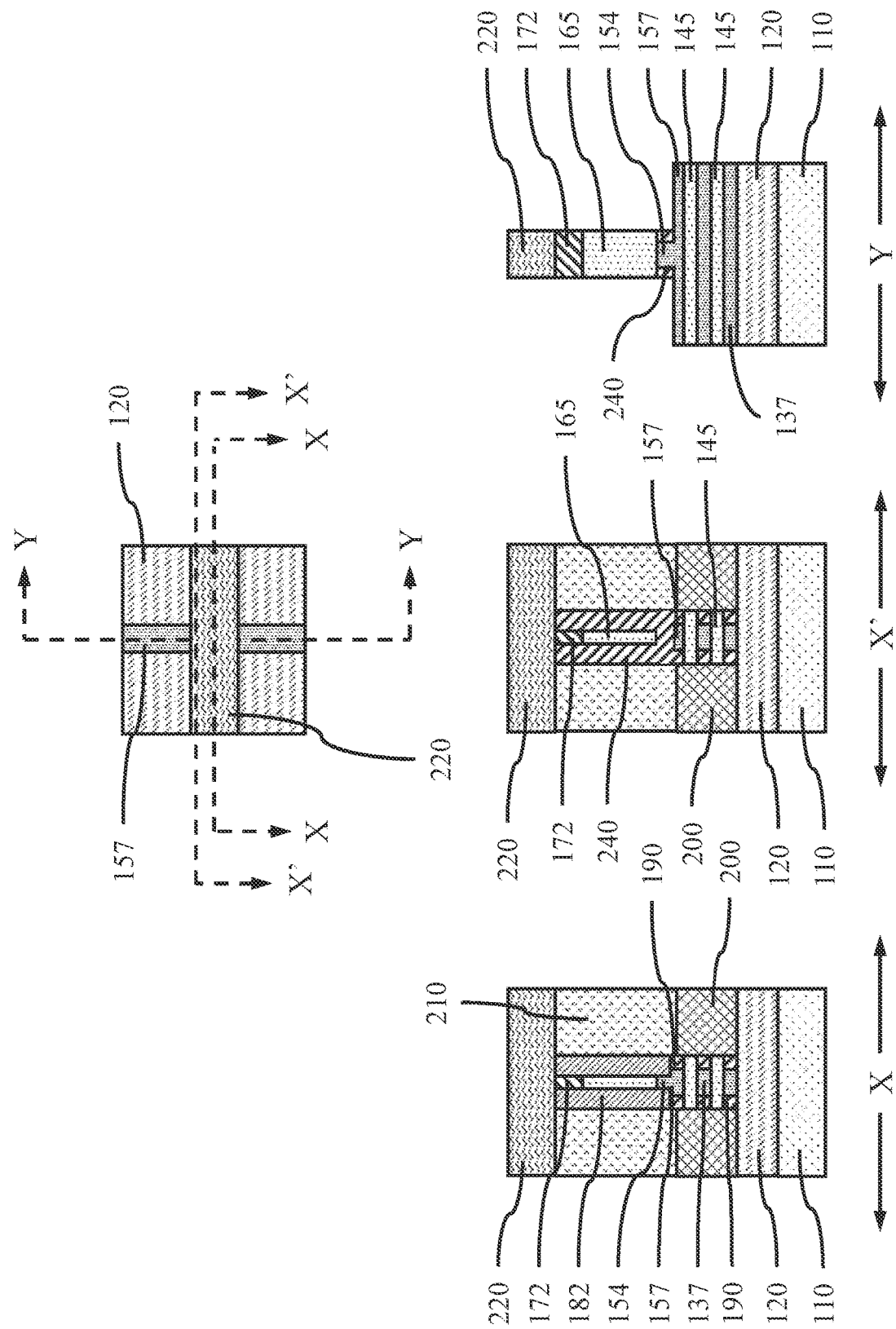
FIG. 9 illustrates a top and cross-sectional side views showing formation of a protective fill in the gap between the fin section and the dielectric fill layer, and collar spacers beneath the vertical fin section, created by removing the portions of the sacrificial spacers, in accordance with an embodiment of the present invention.

FIG. 9 illustrates a top and cross-sectional side views showing formation of a protective fill in the gap between the fin section and the dielectric fill layer, and collar spacers beneath the vertical fin section, created by removing the portions of the sacrificial spacers, in accordance with an embodiment of the present invention.

In one or more embodiments, a protective fill 240 can be formed in the gap 230 between the fin section 165 and the dielectric fill layer 210, and collar spacers 240 can be formed in the collar indentations 235 beneath the vertical fin section, where the protective fill 240 can be formed by a conformal deposition followed by an isotropic etching back. The protective fill 240 can be an insulating dielectric material, including, but not limited to, silicon oxide (SiO), silicon nitride (SiON), silicon oxynitride (SiON), a low-k dielectric material, or a combination thereof. The collar spacers 240 can be on opposite sides of a sacrificial pillar 154 formed by the remaining portions of the sacrificial pad 153 and sacrificial plate 155 beneath the fin section 165.

Figure 10:
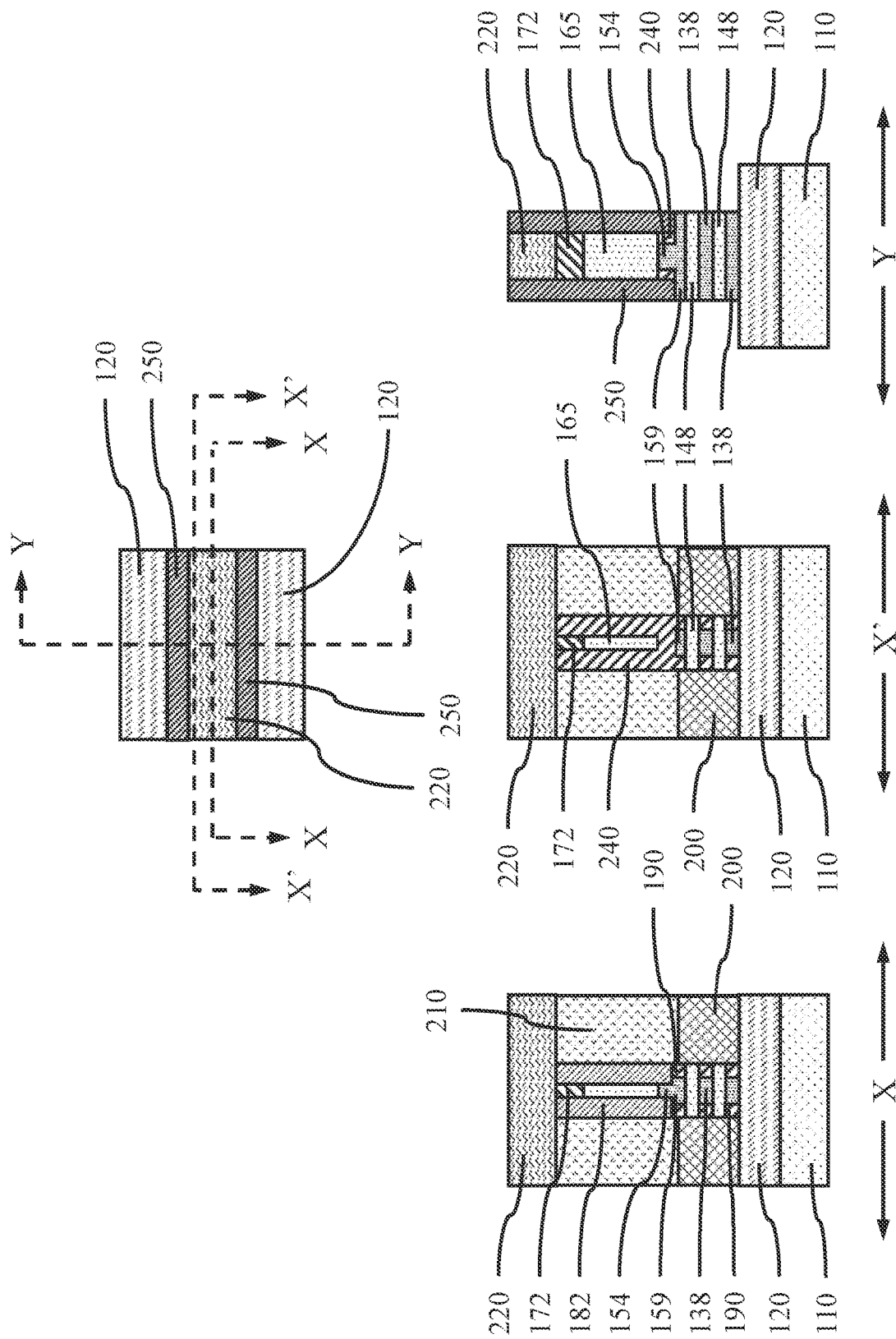
FIG. 10 illustrates a top and cross-sectional side views showing formation of nanosheet templates on opposite sides of the fin section, and removal of exposed portions of the stacked layers, in accordance with an embodiment of the present invention.

FIG. 10 illustrates a top and cross-sectional side views showing formation of nanosheet templates on opposite sides of the fin section, and removal of exposed portions of the stacked layers, in accordance with an embodiment of the present invention.

In one or more embodiments, nanosheet templates 250 can be formed on opposite sides of the fin section 165, where the nanosheet templates 250 can be formed by a layer deposition and directional etching.

In one or more embodiments, the nanosheet templates 250 can have a width in a range of about 20 nm to about 100 nm, or about 35 nm to about 60 nm, although other thicknesses are also contemplated.

In one or more embodiments, exposed portions of the semiconductor channel sections 145, sacrificial semiconductor sections 135, and top sacrificial bar 157 can be removed with selective directional etch(es) to form semiconductor channel segments 148, a top sacrificial semiconductor segment 159, and sacrificial semiconductor segments 137.

Figure 11:
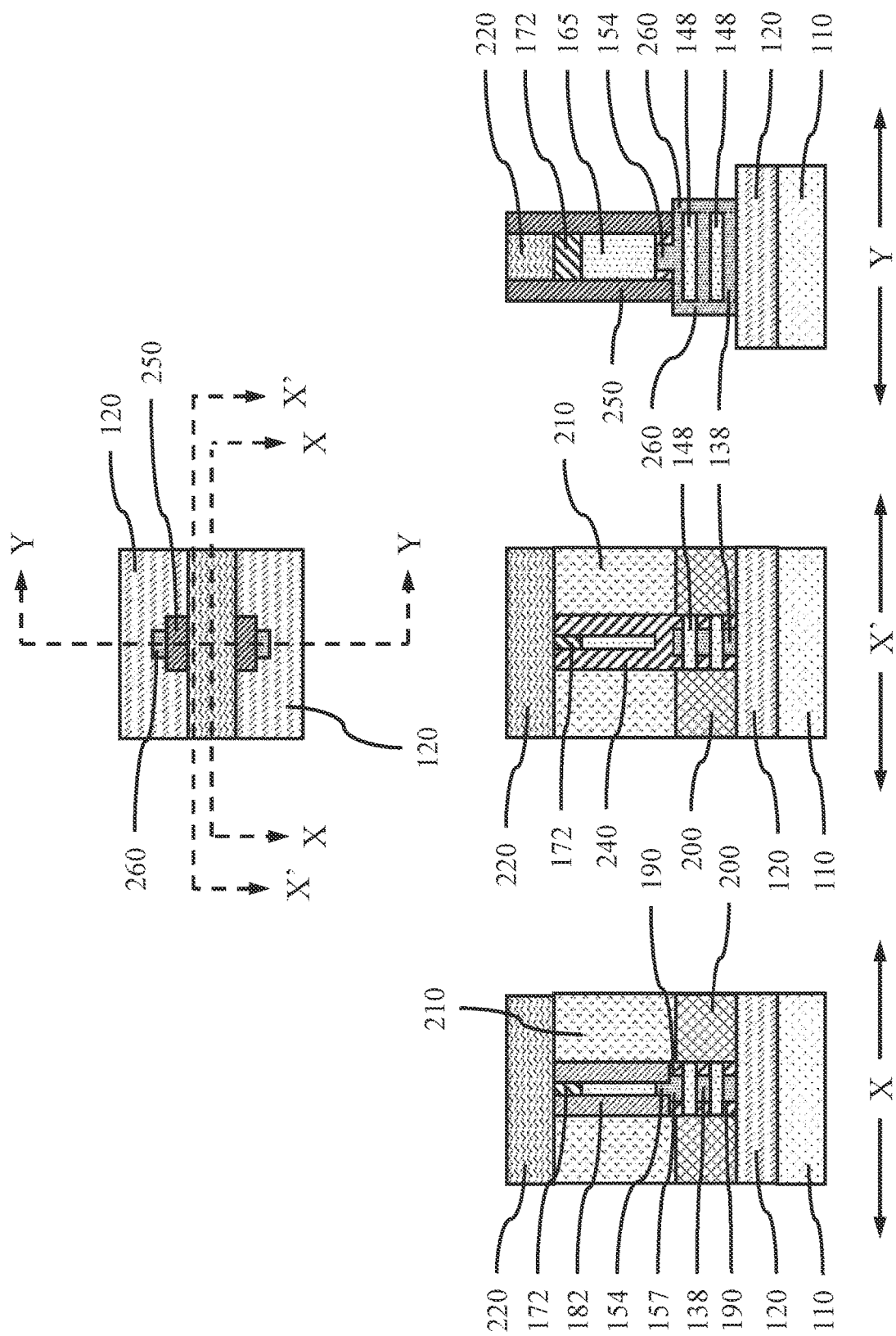
FIG. 11 illustrates a top and cross-sectional side views showing formation of a sacrificial gate extension on the stacked layers, in accordance with an embodiment of the present invention.

FIG. 11 illustrates a top and cross-sectional side views showing formation of a sacrificial gate extension on the stacked layers, in accordance with an embodiment of the present invention.

In one or more embodiments, a sacrificial gate extension 260 can be formed on the remaining stacked layers, including the semiconductor channel segments 148, a top sacrificial semiconductor segment 159, and sacrificial semiconductor segments 138. The sacrificial gate extension 260 can be formed by epitaxial growth on the exposed surfaces of the sacrificial semiconductor segments 138 and semiconductor channel segments 148, where the sacrificial gate extension 260 can be the same material as the sacrificial semiconductor segments 138 to allow selective removal of both the sacrificial semiconductor segments 138 and sacrificial gate extension 260 at the same time.

Figure 12:
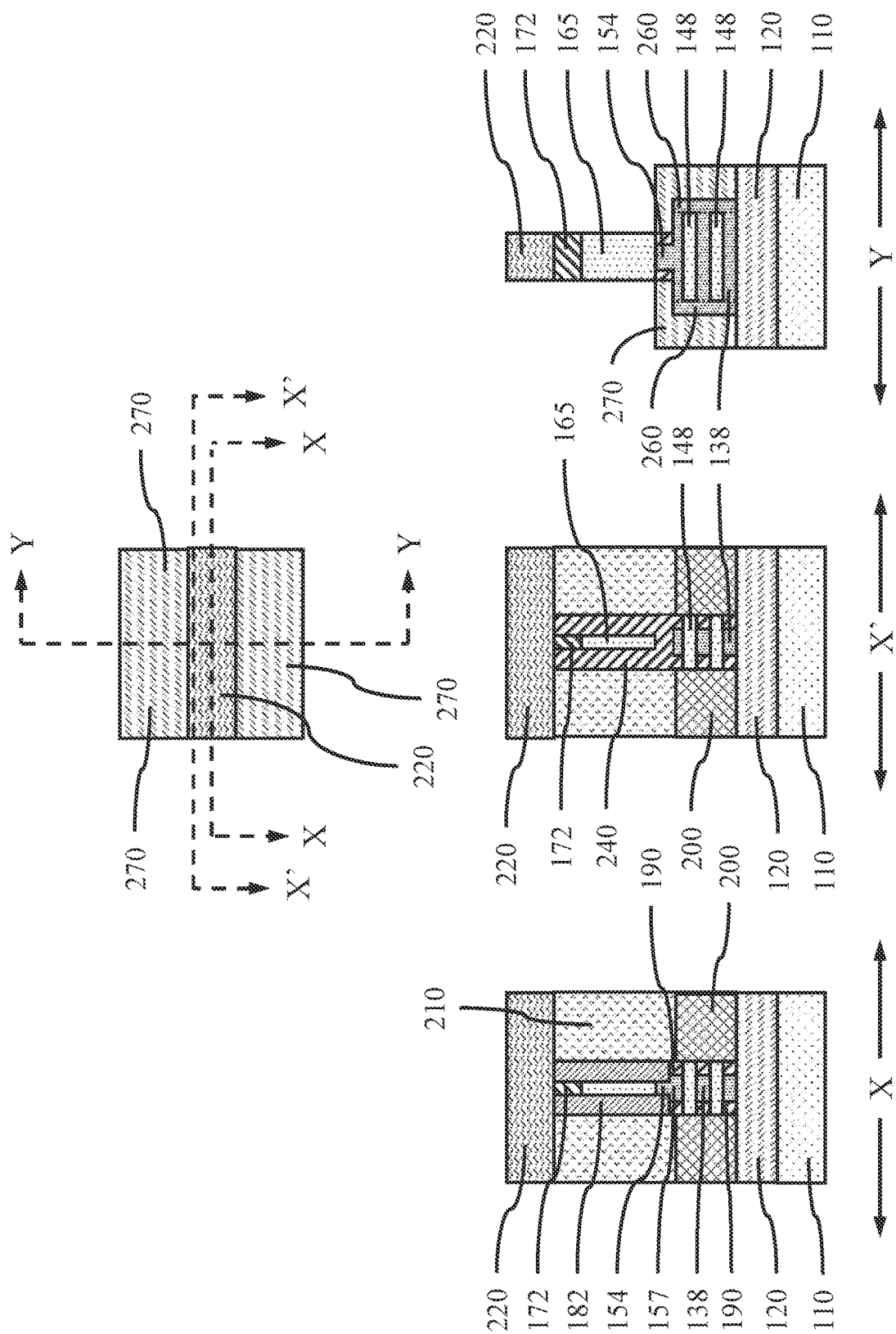
FIG. 12 illustrates a top and cross-sectional side views showing removal of the nanosheet templates, and formation of a bottom dielectric shell on the sacrificial gate extension, in accordance with an embodiment of the present invention.

FIG. 12 illustrates a top and cross-sectional side views showing removal of the nanosheet templates, and formation of a bottom dielectric shell on the sacrificial gate extension, in accordance with an embodiment of the present invention.

In one or more embodiments, the nanosheet templates 250 can be removed using a selective etch.

In one or more embodiments, a bottom dielectric shell 270 can be formed on the sacrificial gate extension 260 on opposite sides of the fin section 165. The bottom dielectric shell 270 can be formed by over-filling a dielectric material on the substrate 110 followed by a chemical-mechanical polishing (CMP) and recessing. The top surface of the bottom dielectric shell 270 can be even with the bottom of the fin section 165 through a controlled recess.

In various embodiments, the bottom dielectric shell 270 can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), a low-k dielectric, and combinations thereof.

Figure 13:
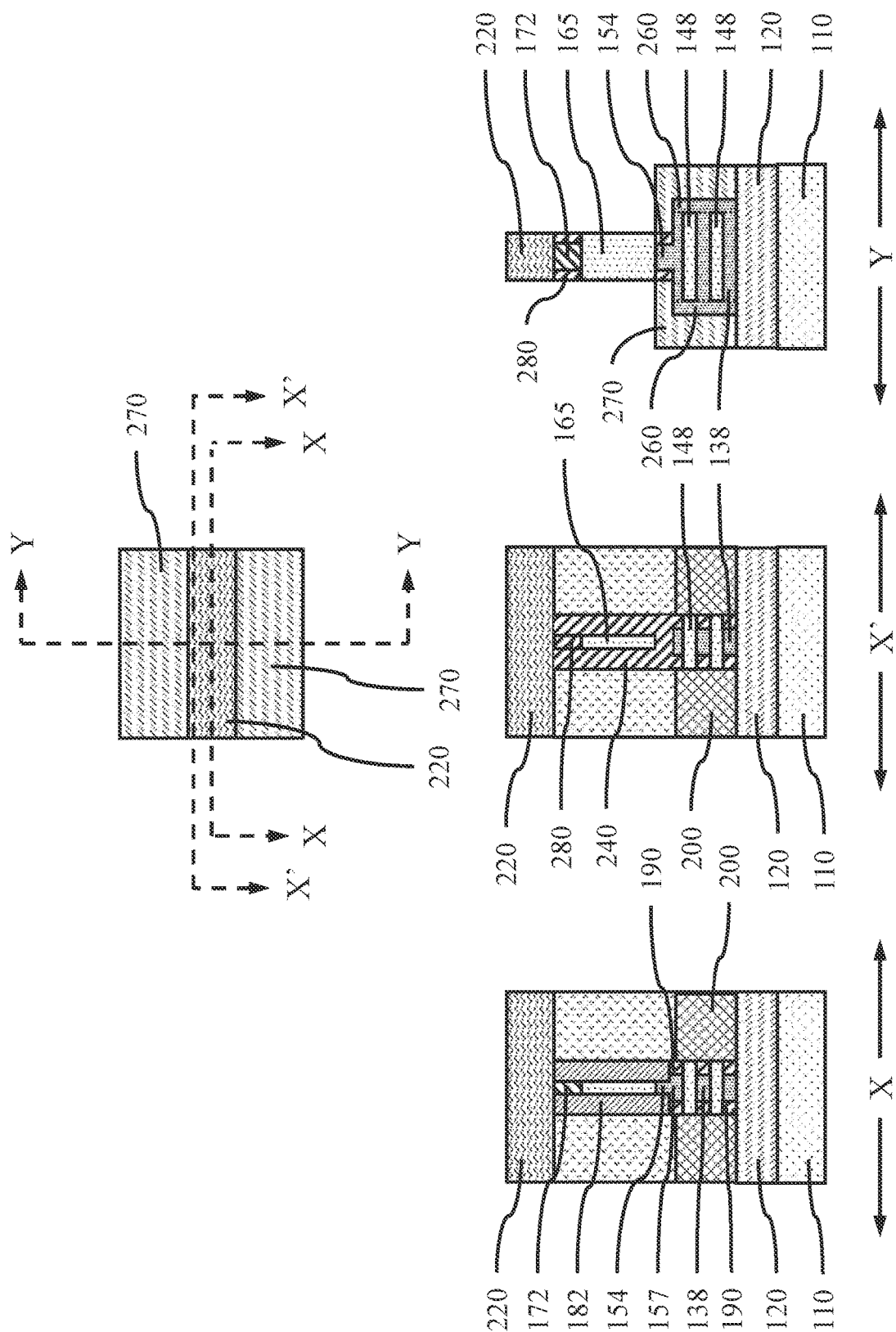
FIG. 13 illustrates a top and cross-sectional side views showing replacement of a portion of the fin template with a top inner spacer on opposite sides of the fin template and between a portion of the protective fill, in accordance with an embodiment of the present invention.

FIG. 13 illustrates a top and cross-sectional side views showing replacement of a portion of the fin template with a top inner spacer on opposite sides of the fin template and between a portion of the protective fill, in accordance with an embodiment of the present invention.

In one or more embodiments, a portion of the fin template 172 can be replaced with a top inner spacer 280 on opposite sides of the fin template, where an outer portion of the fin templates can be removed by an isotropic etch, and top inner spacers 280 formed from a conformal layer deposition followed by an isotropic etching back.

In various embodiments, the top inner spacers 280 can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), a low-k dielectric, and combinations thereof. The top inner spacers 280 can be a different material from the fin template section 172, so the fin template section 172 can be selectively removed.

Figure 14:
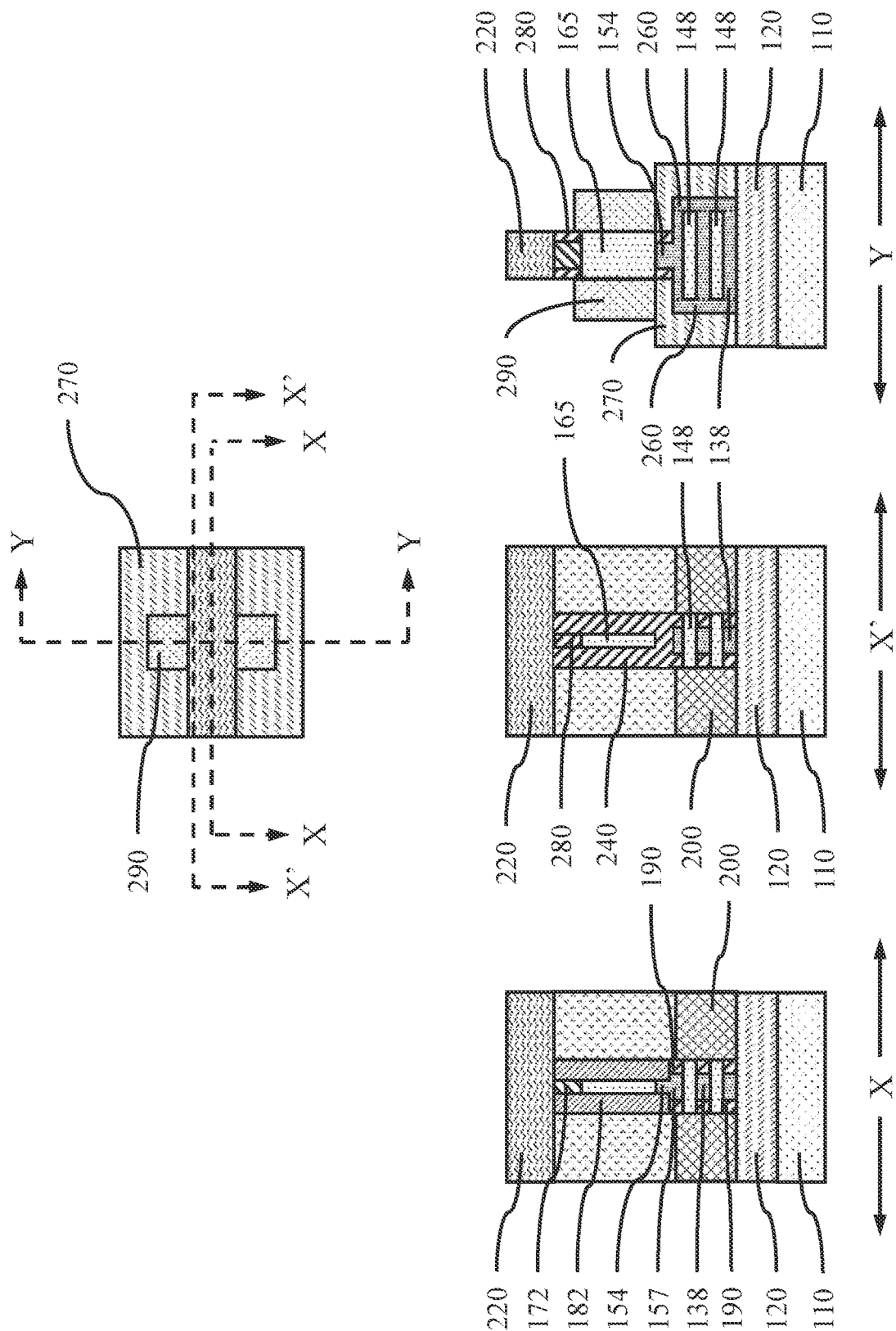
FIG. 14 illustrates a top and cross-sectional side views showing formation of the fin source/drains on opposite sides of the fin section, and location of the nanosheet source/drains on opposite sides of the nanosheet stack, in accordance with an embodiment of the present invention.

FIG. 14 illustrates a top and cross-sectional side views showing formation of the fin source/drains on opposite sides of the fin section, and location of the nanosheet source/drains on opposite sides of the nanosheet stack, in accordance with an embodiment of the present invention.

In one or more embodiments, fin source/drains 290 can be formed on opposite sides of the fin section 165, where the fin source/drains 290 can be formed by lateral epitaxial growth on the exposed surfaces of the fin section 165. The bottom dielectric shell 270 on a lower portion of the shared gate structure can electrically separate the fin source/drains 290 from lower portion of the shared gate structure on the NSFET.

Figure 15:
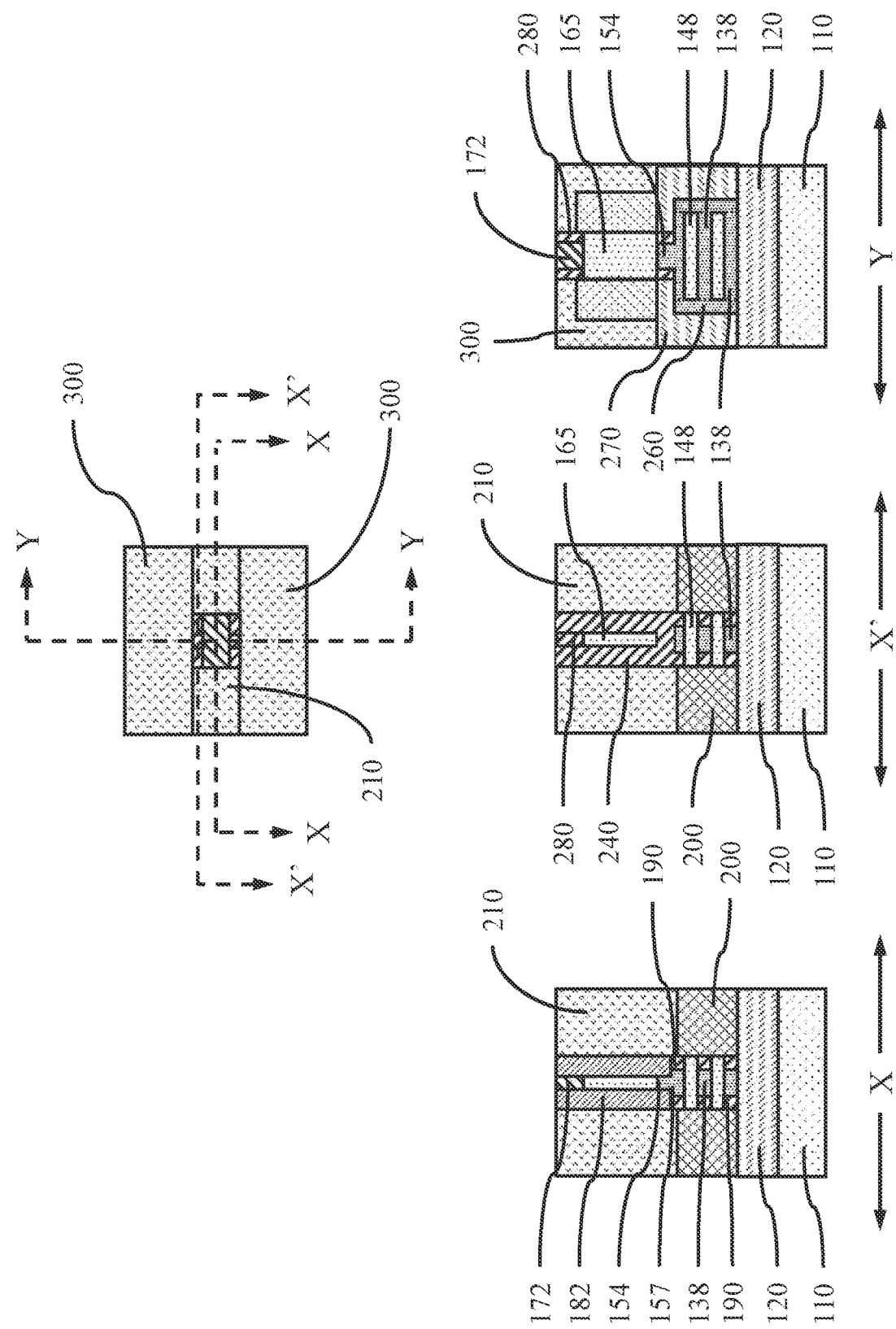
FIG. 15 illustrates a top and cross-sectional side views showing formation of a cover layer on the fin source/drains and bottom dielectric shell, in accordance with an embodiment of the present invention.

FIG. 15 illustrates a top and cross-sectional side views showing formation of a cover layer on the fin source/drains and bottom dielectric shell, in accordance with an embodiment of the present invention.

In one or more embodiments, a cover layer 300 can be formed on the fin source/drains 290 and bottom dielectric shell 270, where the cover layer 300 can be formed by a blanket deposition. The cover layer 300 can fill in a space between portions of dielectric fill layer 210.

In various embodiments, the cover layer 300 can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), a low-k dielectric, and combinations thereof. The cover layer 300 can be the same dielectric material as the dielectric fill layer 210.

Figure 16:
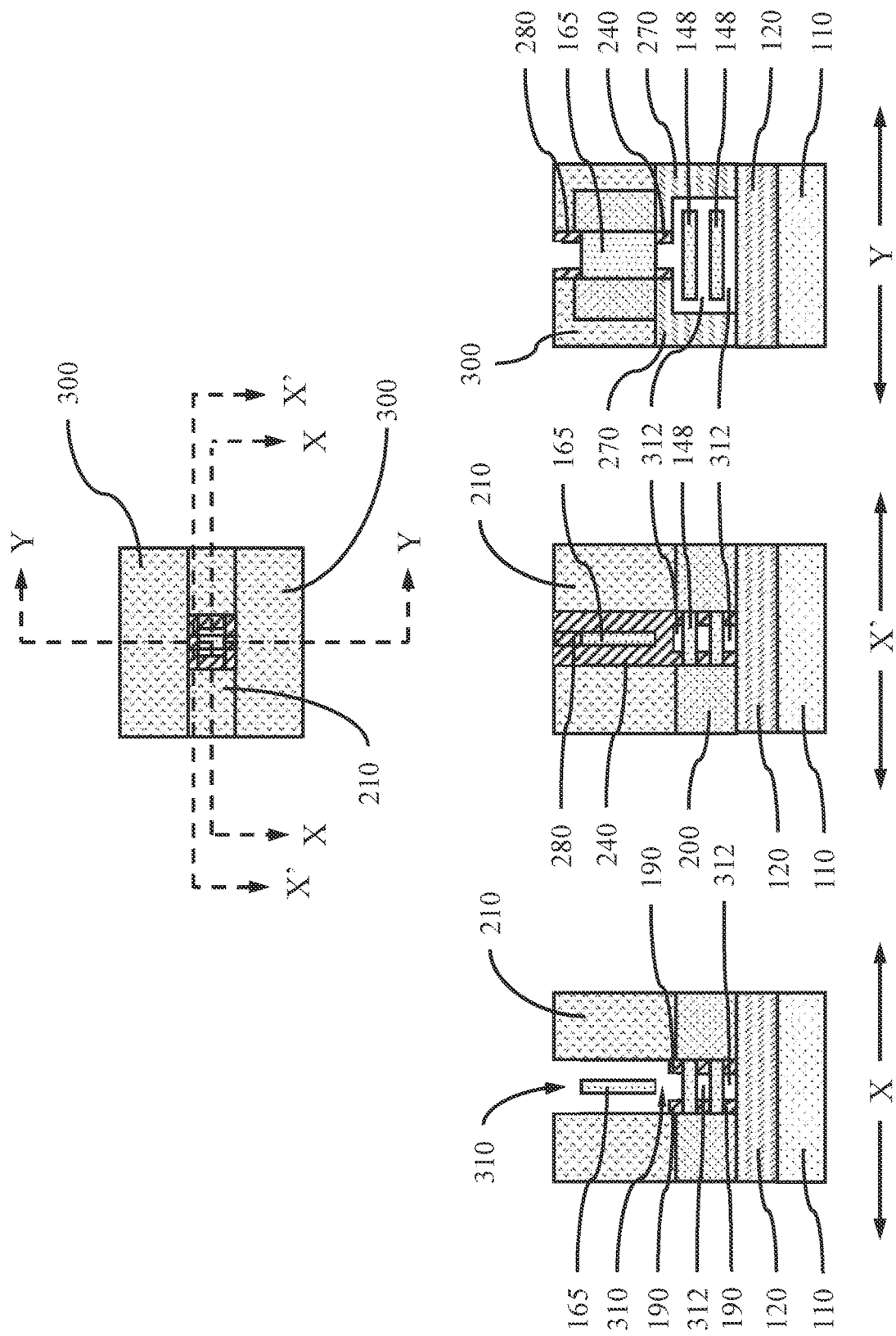
FIG. 16 illustrates a top and cross-sectional side views showing removal of the fin template section and removal of the sacrificial gate extension and sacrificial semiconductor sections between semiconductor nanosheet sections to form the gate channels, and, in accordance with an embodiment of the present invention.

FIG. 16 illustrates a top and cross-sectional side views showing removal of the fin template section and removal of the sacrificial gate extension and sacrificial semiconductor sections between semiconductor nanosheet sections to form the gate channels, and, in accordance with an embodiment of the present invention.

In one or more embodiments, the fin template section 172 can be removed using a selective etch.

In one or more embodiments, the sacrificial spacer section 182 can be removed using a selective etch.

In one or more embodiments, the sacrificial pillar 154, top sacrificial semiconductor segment 159, sacrificial gate extension 260, and sacrificial semiconductor segments 138 can be removed using a selective etch to form gate channels 310 adjoining the fin section 165 and semiconductor channel segments 148. The removal of the sacrificial gate extension 260 can provide space to form a wrap-around gate on the semiconductor channel segments 148.

Figure 17:
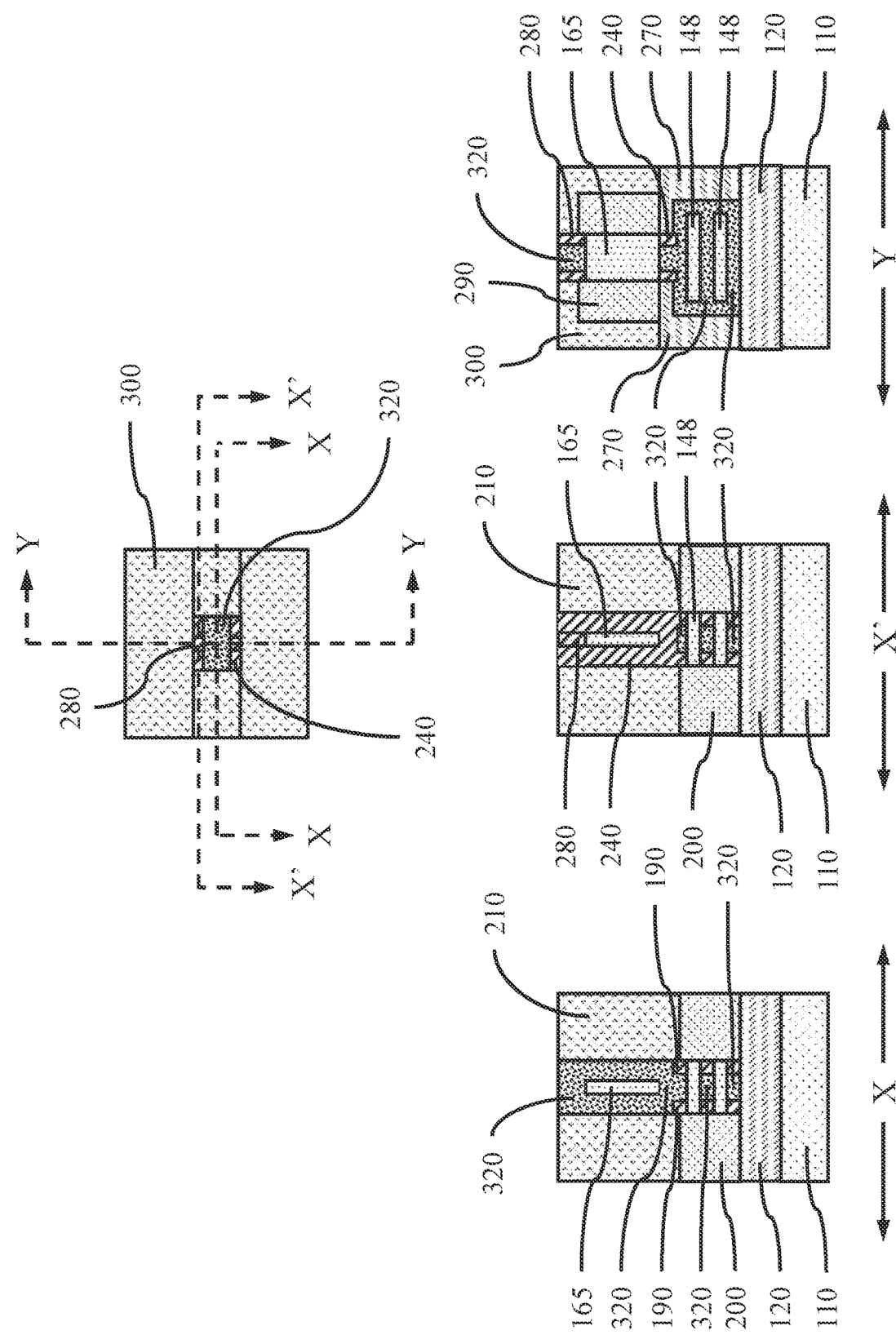
FIG. 17 illustrates a top and cross-sectional side views showing formation of a gate structure in the gap and gate channels, in accordance with an embodiment of the present invention.

FIG. 17 illustrates a top and cross-sectional side views showing formation of a gate structure in the gap and gate channels, in accordance with an embodiment of the present invention.

In one or more embodiments, a gate structure 320 can be formed in the gap and gate channels 310, where the gate structure 320 can be formed by a sequence of conformal depositions to form a gate dielectric layer, a work function layer, and a conductive gate fill. In various embodiments, the gate structure can be a shared gate structure, where the conductive gate fill is on both the fin section 165 and semiconductor channel segments 148, such that the gate structure 320 controls the current flow through both the fin section 165 and semiconductor channel segments 148.

In various embodiments, a lower portion of the shared gate structure 320 can control the current flow and switching of the nanosheet field effect transistor, and an upper portion of the shared gate structure 320 can control the current flow and switching of the fin field effect transistor. The fin field effect transistor and the nanosheet field effect transistor can thereby be operated concurrently.

In various embodiments, the gate dielectric layer can be a dielectric material, including, but not limited to, silicon oxide (SiO), silicon nitride (SiN), silicon oxynitride (SiON), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer can have a thickness in a range of about 1 nm to about 5 nm, or about 2 nm to about 4 nm, although other thicknesses are also contemplated.

In various embodiments, the conductive gate fill can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes, conductive carbon, graphene, or any suitable combination of these materials.

The work function material (WFM) can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and work function material (WFM).

Figure 18:
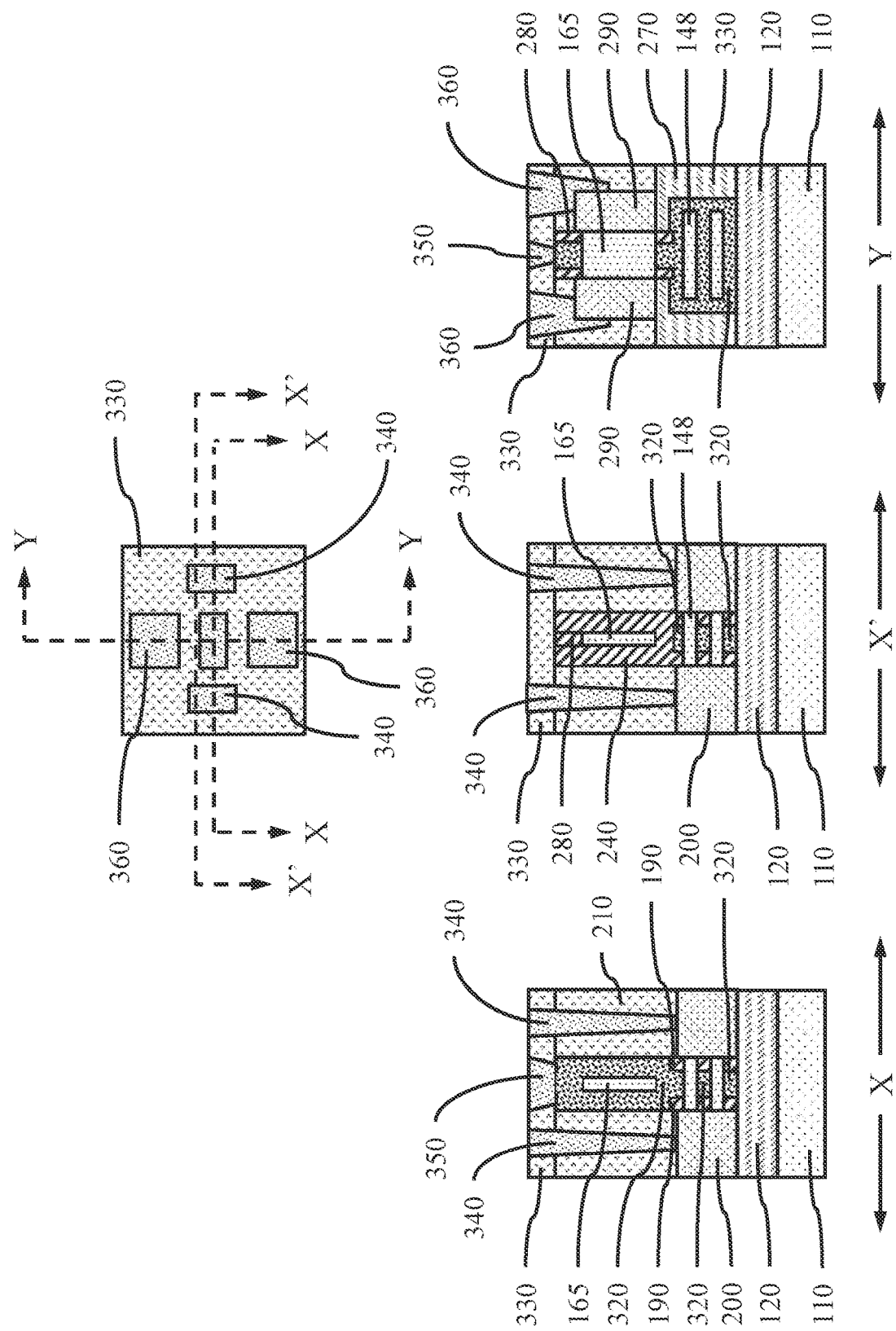
FIG. 18 illustrates a top and cross-sectional side views showing formation of source/drain contacts and a gate contact for the lower nanosheet device and the upper vertical fin device, in accordance with an embodiment of the present invention.

FIG. 18 illustrates a top and cross-sectional side views showing formation of source/drain contacts and a gate contact for the lower nanosheet device and the upper vertical fin device, in accordance with an embodiment of the present invention.

In one or more embodiments, an interlayer dielectric (ILD) layer 330 can be formed on the underlying layers, where the ILD layer 330 can be formed by a blanket deposition.

In various embodiments, the interlayer dielectric (ILD) layer 330 can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), a low-k dielectric, and combinations thereof. The interlayer dielectric (ILD) layer 330 can be the same dielectric material as the cover layer 300 and dielectric fill layer 210.

In one or more embodiments, nanosheet source/drain contacts 340 can be formed in the ILD layer 330 and the dielectric fill layer 210, and a gate contact 350 for the shared gate structure for the lower nanosheet device and the upper vertical fin device can be formed in the ILD layer 330.

In one or more embodiments, fin source/drain contacts 360 can be formed in the ILD layer 330, cover layer 300 and dielectric fill layer 210. The nanosheet source/drain contacts 340, gate contact 350, and fin source/drain contacts 360 can be made of a conductive material, including, but not limited to a metal (e.g., W, Cu, Ta, etc.), a conducting metallic compound material (e.g., TaC, WN, TiN, etc.), doped semiconductor materials (e.g., doped Si), carbon nanotubes, conductive carbon, and combinations thereof. A nanosheet source/drain contact 340 can be on and in electrical communication with each of the two nanosheet source/drain regions 200, and a fin source/drain contact 360 can be on and in electrical communication with each of the two fin source/drains 290, where the nanosheet source/drain contacts 340 are on different sides of the gate contact 350 and shared gate structure than the two fin source/drain contacts 360.

In various embodiments, the two nanosheet source/drain regions 200 on opposite sides of the shared gate structure of the nanosheet transistor device, and the two fin source/drains on opposite sides of the shared gate structure of the fin field effect transistor device are positioned, such that a first axis between the two nanosheet source/drain regions through the shared gate structure crosses a second axis between the two fin source/drains through the shared gate structure at about 90 degrees (e.g., +/−5 degrees). The first axis and the second axis can determine the current flow directions of the NSFET and the FinFET.

Due to the current flow direction of the top and bottom devices being perpendicular to each other, contacts can be located and access nanosheet source/drain regions 200 for the bottom device in an X direction, and can be located and access fin source/drains (S/D) 290 for top devices in a Y direction. In contrast, for a conventional CFET, both top and bottom device currents flows in parallel, where a bottom S/D epi is overlapped by a top S/D epi, such that a contact cannot easily access the bottom S/D epi.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it ill also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabrication the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked transistor device, comprising:
a nanosheet transistor device on a substrate; and
a fin field effect transistor device over the nanosheet transistor device to form the stacked transistor device, wherein the fin field effect transistor device is configured to have a current flow through the fin field effect transistor device perpendicular to a current flow through the nanosheet transistor device.

2. The stacked transistor device of claim 1, wherein the nanosheet transistor device and the fin field effect transistor device include a shared gate structure.

3. The stacked transistor device of claim 2, further comprising a gate contact on and in electrical contact with the shared gate structure.

4. The stacked transistor device of claim 3, further comprising wherein the nanosheet transistor device includes two nanosheet source/drain regions on opposite sides of the shared gate structure, and the fin field effect transistor device includes two fin source/drains on opposite sides of the shared gate structure, such that the two nanosheet source/drain regions are on different sides of the shared gate structure than the two fin source/drains.

5. The stacked transistor device of claim 4, further comprising a nanosheet source/drain contact on and in electrical communication with each of the two nanosheet source/drain regions, and a fin source/drain contact on and in electrical communication with each of the two fin source/drains, wherein the nanosheet source/drain contacts are on different sides of the gate contact and shared gate structure than the two fin source/drain contacts.

6. A stacked transistor device, comprising:
a plurality of stacked semiconductor channel segments on a substrate;
a nanosheet source/drain region on each of opposite sides of the plurality of stacked semiconductor channel segments;
a fin section over the plurality of stacked semiconductor channel segments;
a fin source/drain on each of opposite sides of the fin section;
a shared gate structure on the fin section and the plurality of stacked semiconductor channel segments, wherein the two nanosheet source/drain regions are on opposite sides of the shared gate structure, and the two fin source/drains are on opposite sides of the shared gate structure, such that the two nanosheet source/drain regions are on different sides of the shared gate structure than the two fin source/drains.

7. The stacked transistor device of claim 6, further comprising a protective fill on a portion of the fin section.

8. The stacked transistor device of claim 7, further comprising a gate contact on and in electrical contact with the shared gate structure.

9. The stacked transistor device of claim 8, further comprising a nanosheet source/drain contact on and in electrical communication with each of the nanosheet source/drain regions, and a fin source/drain contact on and in electrical communication with each of the fin source/drains, wherein the nanosheet source/drain contacts are on different sides of the gate contact and shared gate structure than the two fin source/drain contacts.

10. The stacked transistor device of claim 9, further comprising a bottom dielectric shell on a lower portion of the shared gate structure, wherein a portion of the bottom dielectric shell electrically separates the fin source/drains from lower portion of the shared gate structure.

11. The stacked transistor device of claim 9, further comprising an insulating layer between the substrate and the shared gate structure.

12. A method of forming a stacked transistor device, comprising:

forming a plurality of stacked semiconductor channel segments and a fin section over the plurality of stacked semiconductor channel segments on a substrate;
forming a nanosheet source/drain region on each of opposite sides of the plurality of stacked semiconductor channel segments;
forming a fin source/drain on each of opposite sides of the fin section;
forming a shared gate structure on the fin section and the plurality of stacked semiconductor channel segments, wherein the two nanosheet source/drain regions are on opposite sides of the shared gate structure, and the two fin source/drains are on opposite sides of the shared gate structure, such that the two nanosheet source/drain regions are on different sides of the shared gate structure than the two fin source/drains.

13. The method of claim 12, further comprising forming a bottom dielectric shell on a lower portion of the shared gate structure, wherein a portion of the bottom dielectric shell electrically separates the fin source/drains from lower portion of the shared gate structure.

14. The method of claim 13, further comprising forming a cover layer on the fin source/drains and the bottom dielectric shell.

15. The method of claim 14, further comprising forming a nanosheet source/drain contact on and in electrical communication with each of the nanosheet source/drain regions.

16. The method of claim 15, further comprising forming a fin source/drain contact on and in electrical communication with each of the fin source/drains.

17. The method of claim 16, further comprising forming a gate contact on and in electrical contact with the shared gate structure.

18. The method of claim 17, wherein the nanosheet source/drain contacts are on different sides of the gate contact and shared gate structure than the two fin source/drain contacts.

19. The method of claim 18, further comprising forming a dielectric fill layer on the fin source/drains and the nanosheet source/drain regions.

20. The method of claim 19, further comprising forming a protective fill on a portion of the fin section and the dielectric fill layer.

* * * * *